United States Patent
Chou et al.

(10) Patent No.: US 7,218,177 B2
(45) Date of Patent: May 15, 2007

(54) PHASE LOCKED LOOP WITH NONLINEAR PHASE-ERROR RESPONSE CHARACTERISTIC

(75) Inventors: Yu-Pin Chou, Miao-Li Hsien (TW); Chia-Liang Chiang, Taipei Hsien (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 42 days.

(21) Appl. No.: 11/160,767

(22) Filed: Jul. 7, 2005

(65) Prior Publication Data
US 2006/0012438 A1 Jan. 19, 2006

(30) Foreign Application Priority Data
Jul. 13, 2004 (TW) .............. 93120890 A

(51) Int. Cl.
*H03L 7/00* (2006.01)

(52) U.S. Cl. .............. 331/17; 331/16; 331/177 R; 331/34

(58) Field of Classification Search .............. 331/16, 331/17, 1 A, 34, 177 R
See application file for complete search history.

(56) References Cited

U.S. PATENT DOCUMENTS 5,036,294 A * 7/1991 McCaslin .............. 331/1 A
7,119,628 B2 * 10/2006 Ravi et al. .............. 331/186

* cited by examiner

*Primary Examiner*—Arnold Kinkead
(74) *Attorney, Agent, or Firm*—Winston Hsu

(57) ABSTRACT

A phase-locked loop includes a phase/frequency detector for generating phase error signal according to a reference signal and an input signal, a charge pump for outputting a voltage signal according to the phase error signal, a voltage-controlled oscillator for outputting an output signal corresponding to the phase error signal according to the voltage signal, an adaptive adjusting unit for outputting a control signal according to the phase error signal, so as to form a nonlinear between the output signal and the phase error signal.

16 Claims, 7 Drawing Sheets

PHASE LOCKED LOOP WITH NONLINEAR PHASE-ERROR RESPONSE CHARACTERISTIC

BACKGROUND OF THE INVENTION

1. Field of the Invention

The present invention relates to a phase-locked loop, and more particularly, to a phase-locked loop with nonlinear phase-error response characteristic.

2. Description of the Prior Art

Please refer to FIG. 1, which is a functional block diagram of a conventional analog phase-locked loop (PLL) 10. The PLL 10 comprises a phase/frequency detector (PFD) 12, a charge pump (CP) 14, a charge control circuit 16, a voltage-controlled oscillator (VCO) 18, and a frequency divider 20. The PFD 12 compares a reference signal and a feedback signal generated by the frequency divider 20, and generates a phase error signal, whose magnitude is proportional to a phase/frequency difference between the reference signal and the feedback signal. The CP 14 charges/discharges the charge control circuit 16 according to the phase error signal. The charge control circuit 16 generates a control voltage signal in accordance with the charges stored by the charge control circuit 16. The VCO 18 generates an output signal according to the control voltage signal, the output signal having a frequency proportional to a magnitude of the control voltage signal. The frequency divider 20 divides the output signal output from the VCO 18 and outputs the feedback signal to the PFD 12.

A conventional PLL's 10 phase-error response characteristic, i.e. a corresponding relation between the phase error signal and the output signal, is usually linear. In some circumstances and applications, the PLL's 10 phase-error response characteristic is nonlinear, as shown in FIG. 2 and FIG. 3, and this is usually done by the charge control circuit 16. However, the charge control circuit 16 of the conventional PLL 10 can't be adjusted adaptively because the components thereof such as the resistor and the capacitor shown in FIG. 1 have fixed characteristics. Moreover, due to the process variation and other unexpected factors, the characteristics of electronic components of the analog PLL 10 differ significantly, and the phase-error response characteristic of the analog PLL 10 is therefore neither controllable nor predictable.

SUMMARY OF THE INVENTION

It is therefore an objective of the claimed invention to provide a PLL for overcoming the drawbacks of the prior art.

According to an embodiment of the claimed invention, the PLL includes a phase/frequency detector for generating a phase error signal according to a reference signal and an input signal, a charge pump for outputting a charge signal according to the phase error signal, a charge-controlled circuit for outputting a voltage signal according to the charge signal, a voltage-controlled oscillator for outputting an output signal corresponding to the phase error signal according to the voltage signal, and an adjusting unit for outputting a control signal according to the phase error signal, so as to form a nonlinear relation between the output signal and the phase error signal.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
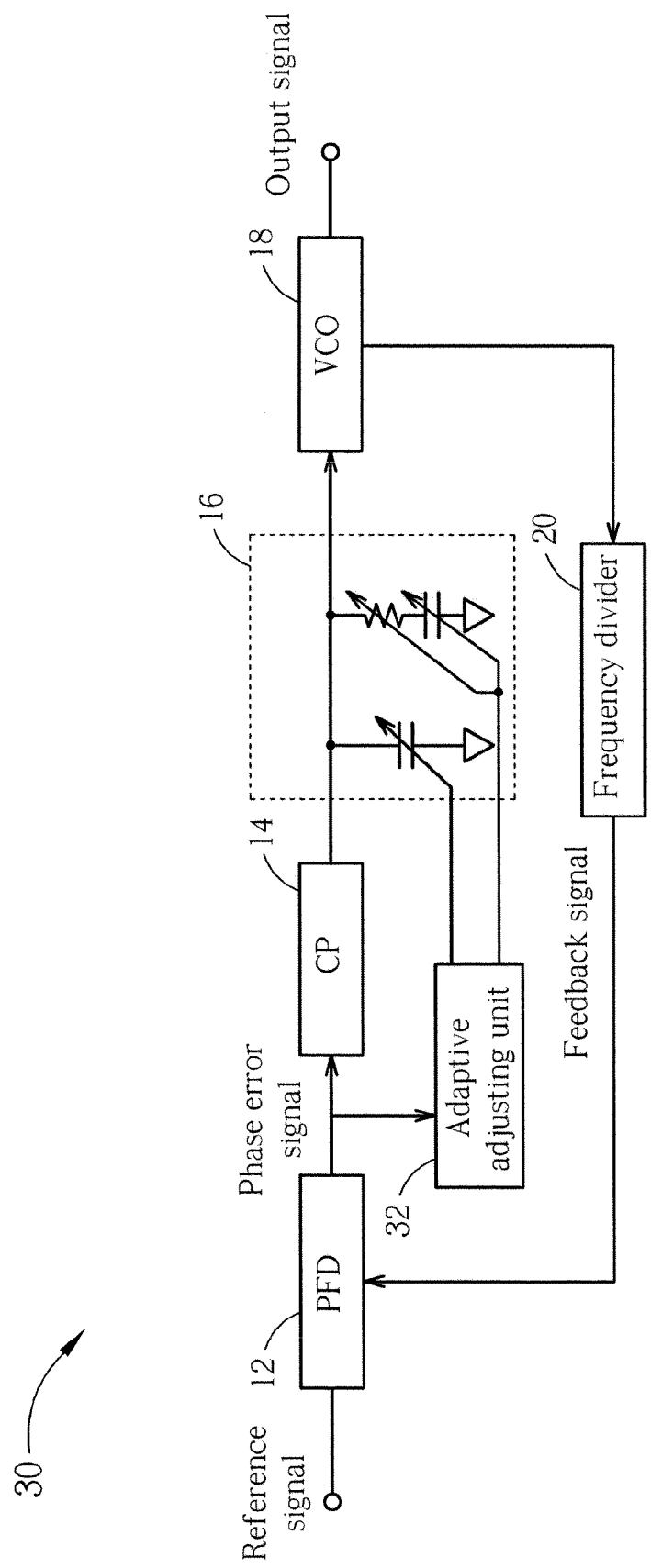
FIG. 4 is a functional block diagram of a PLL of a first embodiment according to the present invention.

Please refer to FIG. 4, which is a functional block diagram of an analog PLL 30 of a first preferred embodiment according to the present invention. In addition to the PFD 12, the CP 14, the charge control circuit 16, the VCO 18, the frequency divider 20, the PLL 30 further comprises an adaptive adjusting unit 32 electrically coupled between the charge control circuit 16 and an output end of the PFD 12.

Figure 1:
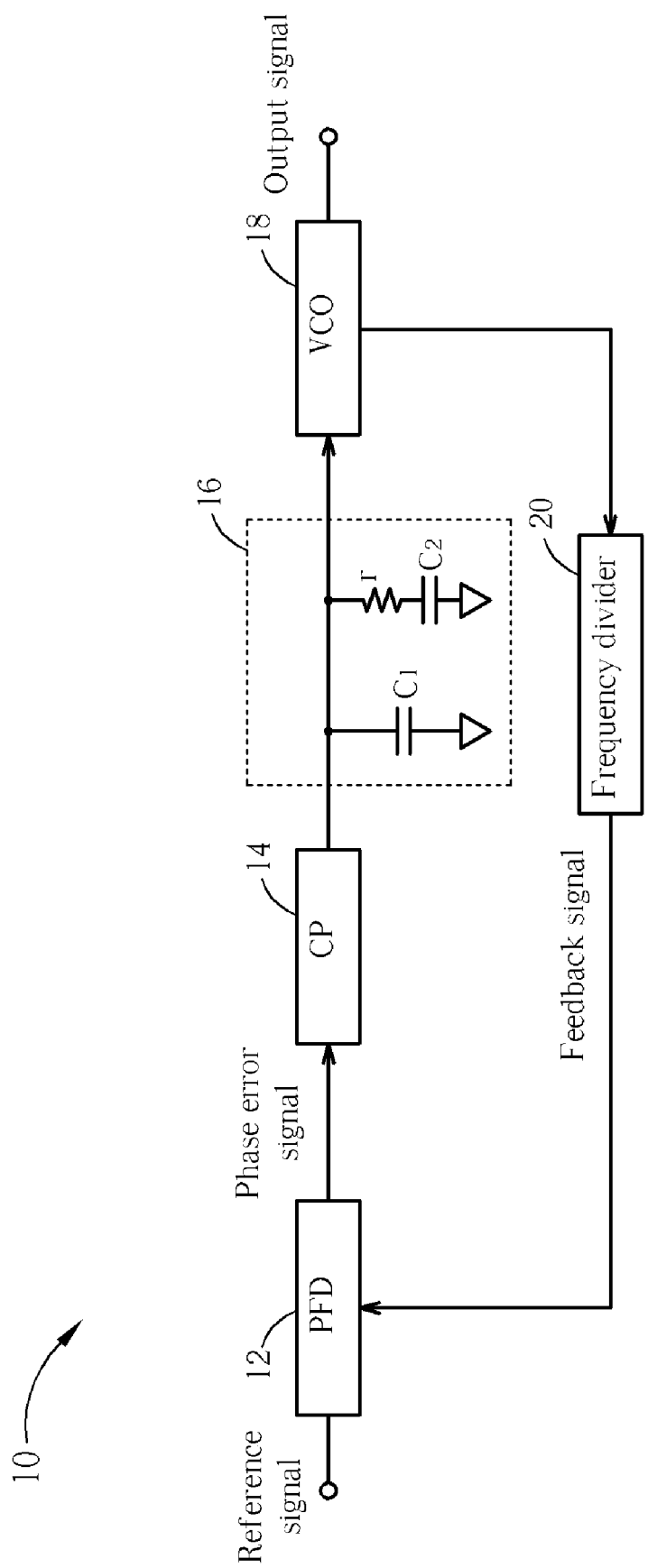
FIG. 1 is a functional block diagram of an analog PLL according to the prior art.
Figure 2:
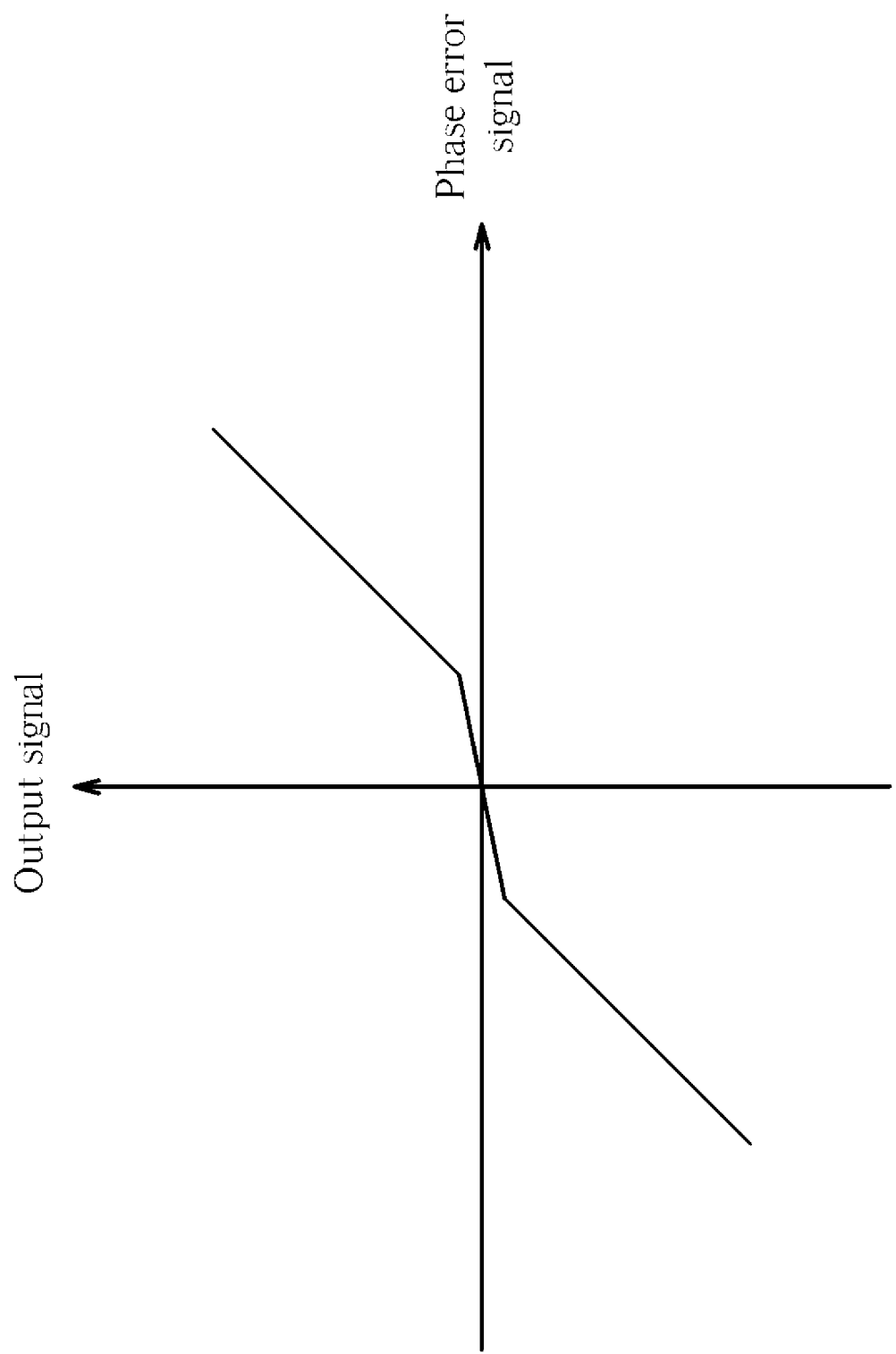
FIG. 2 is a relation diagram showing a corresponding relation between an output signal and a phase-error signal generated by the analog PLL shown in FIG. 1 according to the prior art.
Figure 3:
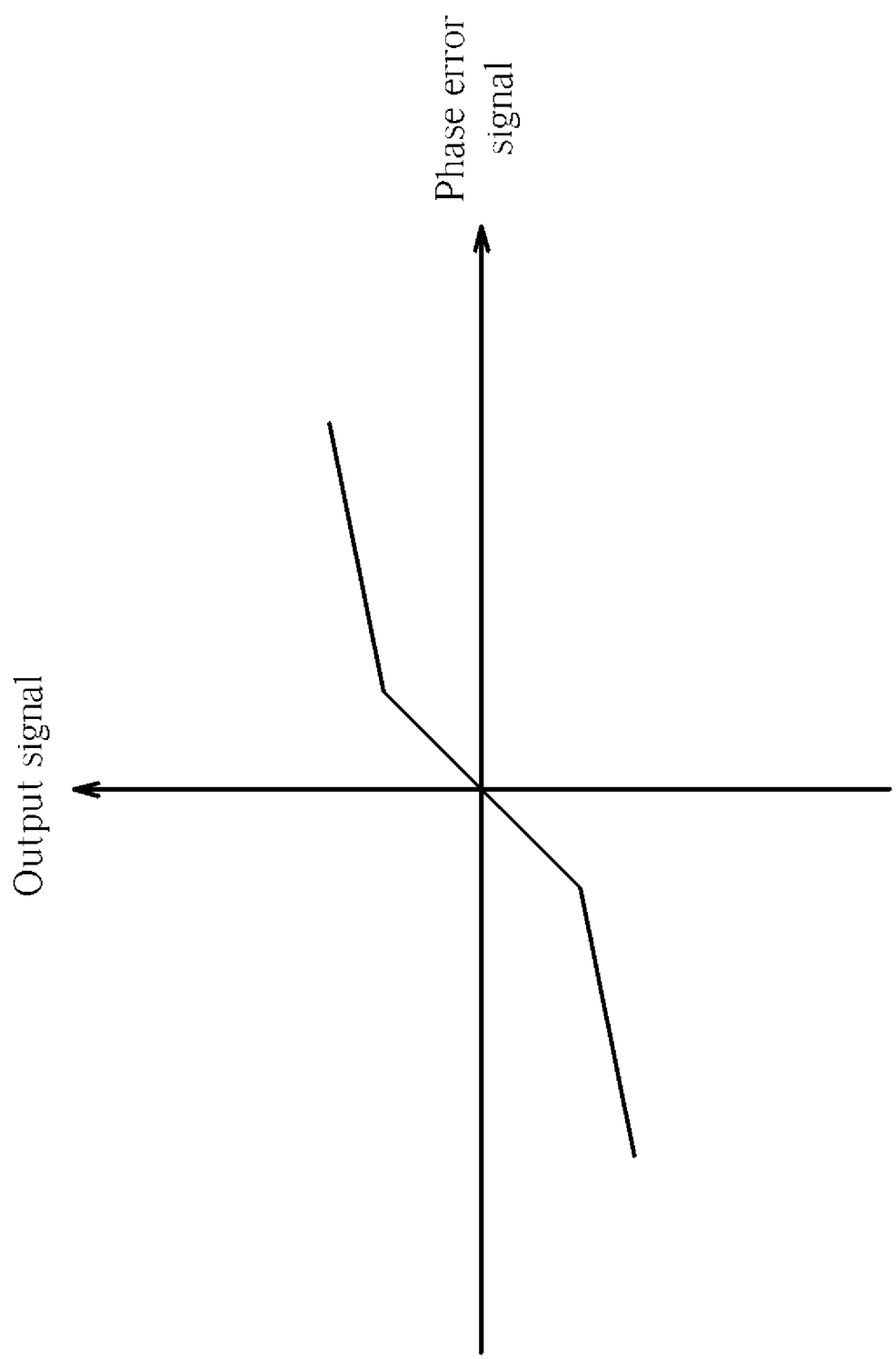
FIG. 3 is another relation diagram showing a corresponding relation between an output signal and a phase-error signal generated by the analog PLL shown in FIG. 1 according to the prior art.

The adaptive adjusting unit 32 analyzes the phase error signal's various characteristics, such as a maximum value, a minimum value, a peak-to-peak value, and a root mean square value, etc., and sets the characteristics of components of the charge control circuit 16. In the exemplary functional block diagram of FIG. 4, the adaptive adjusting unit 32 analyzes the phase error signal and adaptively adjusts the capacitances of the capacitors C1 and C2 and/or the resistance of the resistor r. Therefore, the PLL 30 can have a phase-error response characteristic similar to those shown in FIG. 2 and FIG. 3, and the phase-error response characteristic of the PLL 30 can be adaptively adjusted by the adaptive adjusting unit 32 according to the phase error signal.

Figure 5:
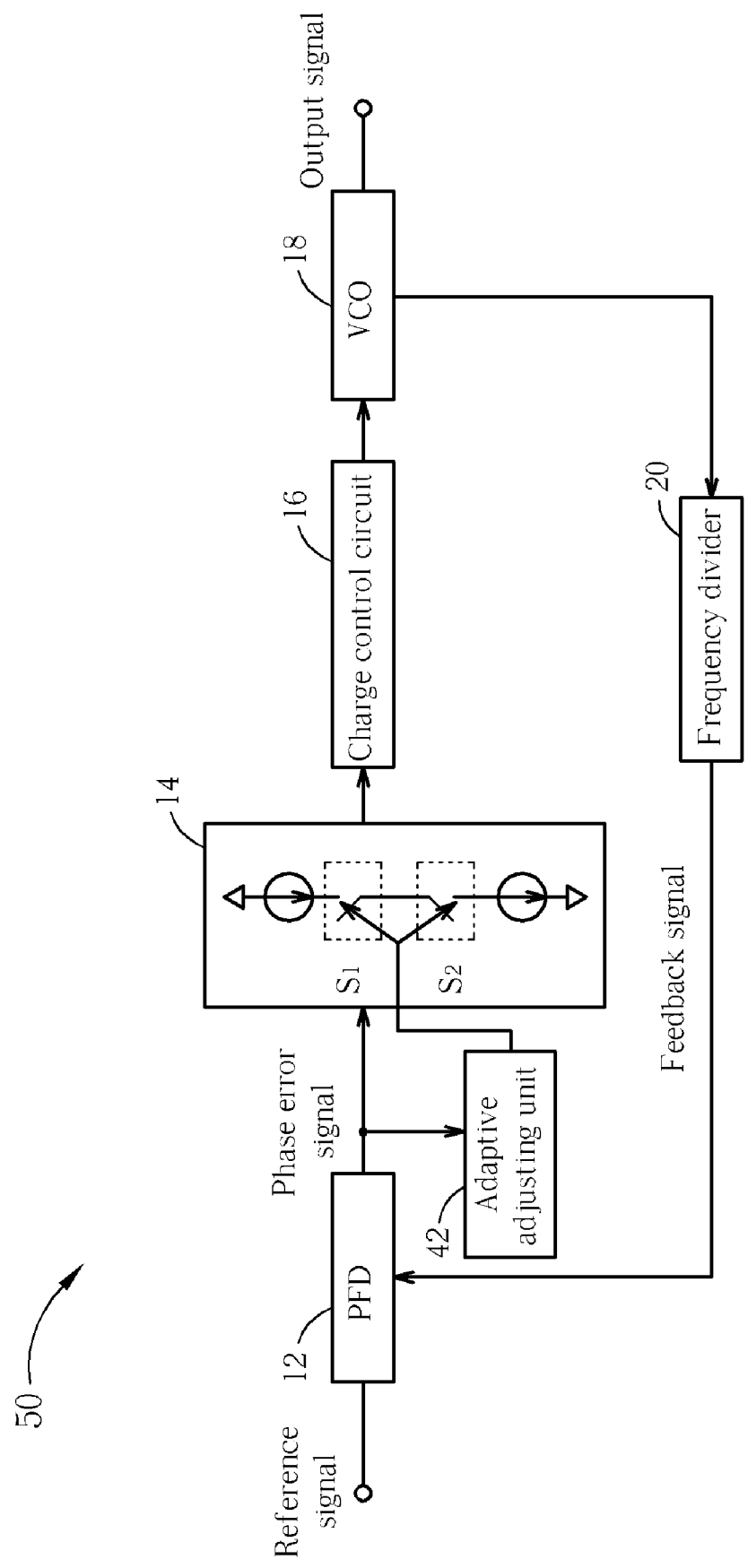
FIG. 5 is a functional block diagram of a PLL of a second embodiment according to the present invention.

Please refer to FIG. 5, which is a functional block diagram of another PLL 40 of a second preferred embodiment according to the present invention. In the exemplary functional block diagram of FIG. 5, the adaptive adjusting unit 42 analyzes the characteristics of the phase error signal and controls signals traveling from the CP 14 to the charge control circuit 16 by controlling two control switches S1 and S2, which are electrically coupled to a first current source and a second current source respectively. Therefore, the PLL 40 can also have a phase-error response characteristic similar to those shown in FIG. 2 and FIG. 3, and the phase-error response characteristic of the PLL 40 can be adaptively adjusted by the adaptive adjusting unit 42 according to the characteristics of the phase error signal.

How the adaptive adjusting units 32 and 42 analyze the characteristics of the phase error signal and controls the remaining components of the PLLs 30 and 40 have been described above in great detail, so the skilled in the art can refer the paragraphs above and develop the adaptive adjusting unit 32 shown in FIG. 4 and the adaptive adjusting unit 42 shown in FIG. 5.

Figure 6:
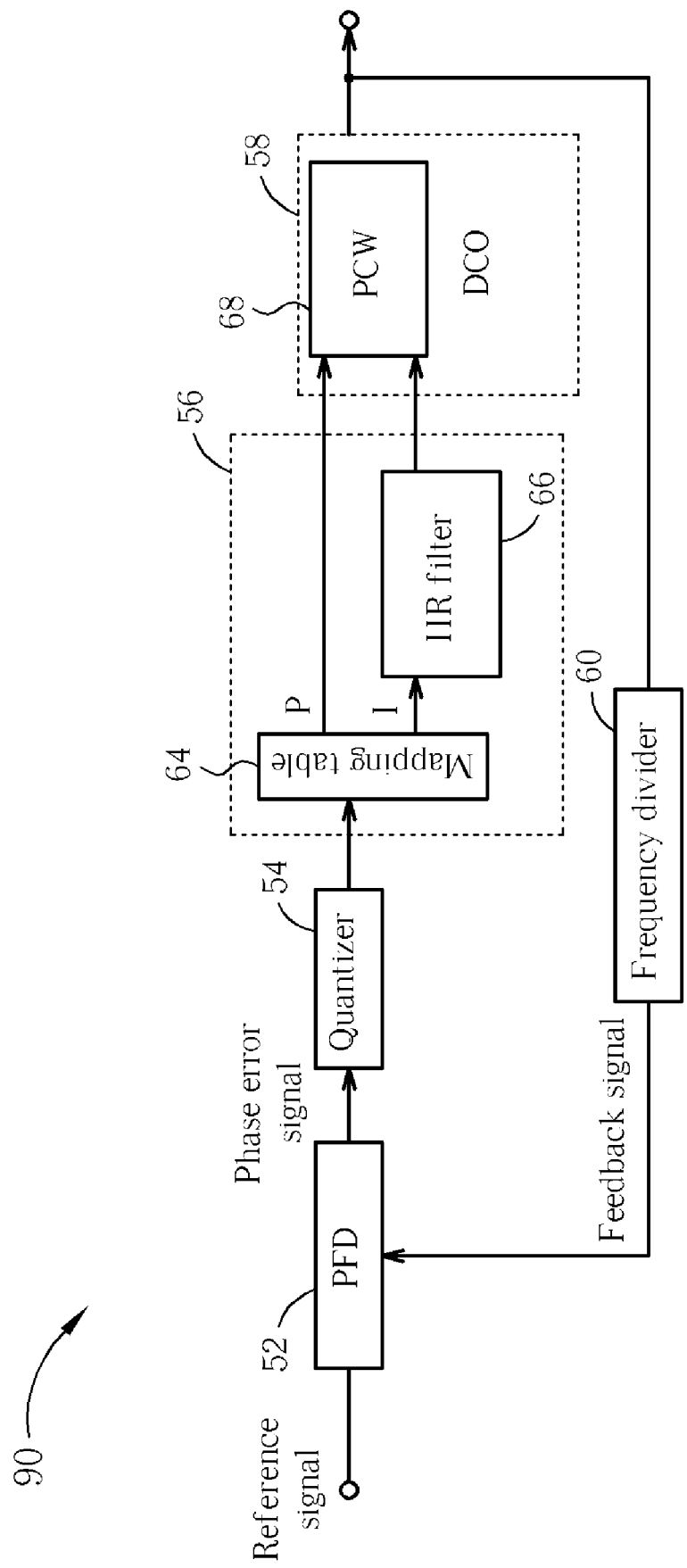
FIG. 6 is a functional block diagram of a PLL of a third embodiment according to the present invention.

A digital PLL 50 is also disclosed here to implement the present invention. Please refer to FIG. 6, which is a functional block diagram of a digital PLL 50 of a third preferred embodiment according to the present invention. The PLL 50 comprises a PFD 52, a quantizer 54 for quantizing a phase error signal generated by the PFD 52, a controlled counter 56 for outputting a count signal according to the quantized phase error signal, a frequency divider 60, and a numerical-controlled oscillator (DCO) 58 for generating an output signal according to the count signal output from the controlled counter 56 and for feeding the output signal back to the PFD 52 via the frequency divider 60.

According to the third preferred embodiment, the controlled counter 56 comprises a proportional/integral controller (P/I controller) 66 and a mapping table 64 for storing a corresponding relation between a count control signal and the quantized phase error signal output from the quantizer 54 and for outputting a corresponding count control signal, such as a proportional signal and an integral signal, to the P/I controller 66 according to the magnitude of the quantized phase error signal. In this embodiment, the P/I controller 66 comprises an infinite impulse response filter (IIR filter) 66 which may adjust it's coefficients according to the integral signal. The integral signal, together with an IIR control signal, both of which are output from the IIR filter 66, are input to a period control word (PCW) circuit 68 of the DCO 58. The PCW circuit 68 controls the output signal according to the IIR control signal and the integral signal. Therefore, the PLL 50 can also have a phase-error response characteristic similar to those shown in FIG. 2 and FIG. 3, and the phase-error response characteristic of the PLL 50 can be adaptively adjusted according to the characteristics of the phase error signal.

In the third preferred embodiment, the corresponding relation stored in the mapping table 64 between the count control signal and the quantized phase error signal can be adaptively adjusted according to the characteristics of the phase error signal.

Figure 7:
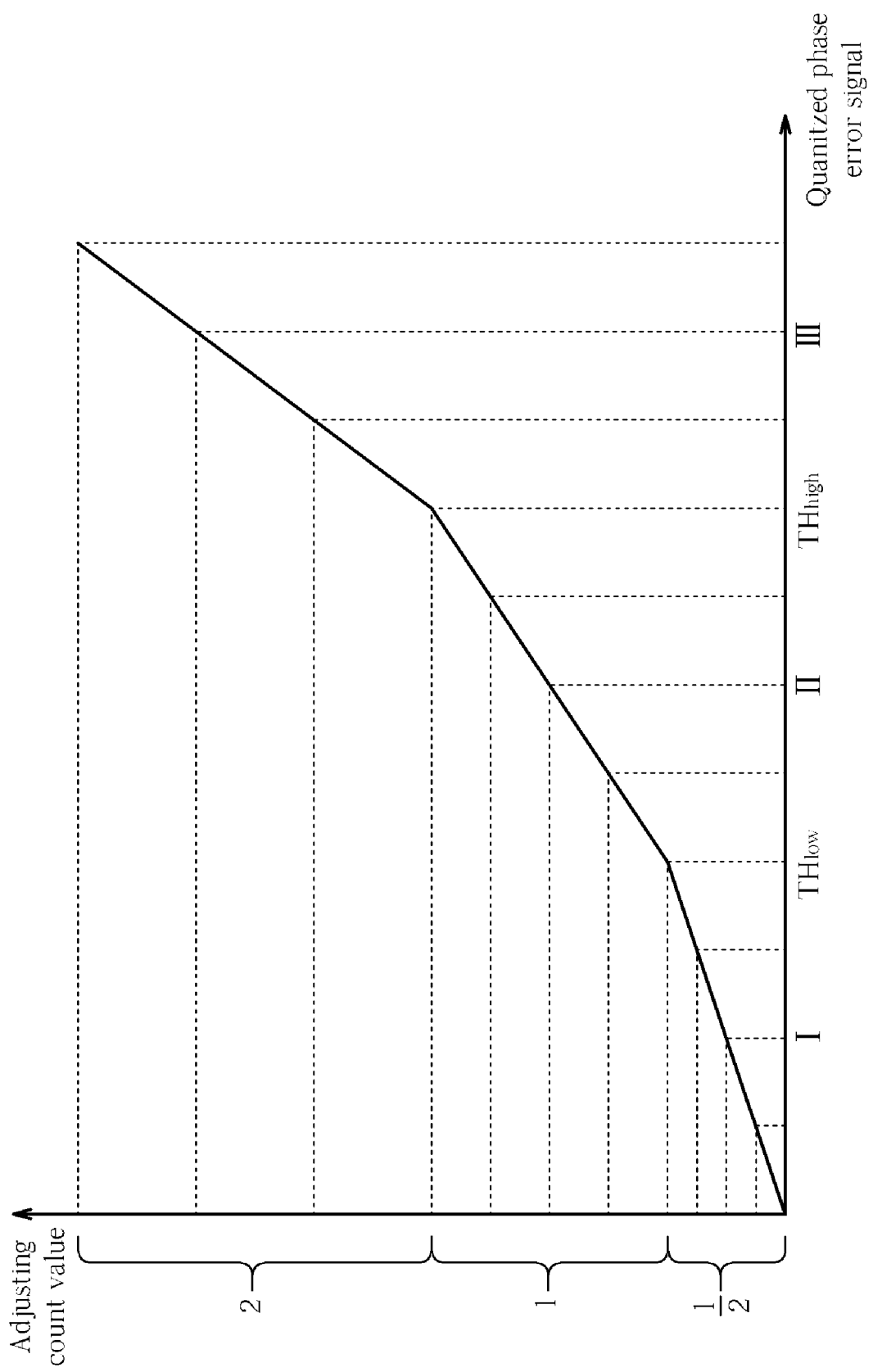
FIG. 7 is shows the relation between a quantized phase error signal stored in the mapping table of FIG. 6 and an adjusting count value.

Please refer to FIG. 7, which is a relation diagram of the quantized phase error signal and an adjusting count value corresponding to the count control signal according to the present invention, where an abscissa represents the quantized phase error signal, and an ordinate represents the adjusting count value. As far as the abscissa of the relation diagram is concerned, the quantized phase error signal is divided into a low value region I, a normal value region II, and a high value region III. As the name implies, any quantized phase error signal within the low value region is lower than a low threshold $TH_{low}$, while any quantized phase error signal within the high value region is higher than a high threshold $TH_{high}$. In the high value region, any two neighboring quantized phase error signals' corresponding adjusting count values have a difference twice as large as that of two adjusting count values corresponding to two neighboring quantized phase error signals in the normal value region, and four times as large as that of two adjusting count values corresponding to two neighboring quantized phase error signals in the low value region. In short, the PLL 50 adaptively updates and sets the count control signal output from the mapping table 64 according to the quantized phase error signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase-locked loop with nonlinear phase-error response characteristic, the phase-locked loop comprising:
   a phase/frequency detector for generating a phase error signal according to a reference signal and an input signal;
   a charge pump for outputting a charge signal according to the phase error signal;
   an adaptive adjusting unit for outputting a control signal according to the phase error signal;
   a charge-controlled circuit for outputting a voltage signal according to the charge signal, comprising:
      a resistor coupled to the charge pump;
      a first capacitor coupled to the resistor; and
      a second capacitor coupled to the charge pump, wherein at least one of the resistance of the resistor, the capacitance of the first capacitor and the capacitance of the second capacitor is controlled by the control signal outputted by the adaptive adjusting unit; and
   a voltage-controlled oscillator for outputting an output signal according to the voltage signal, the output signal being used as the input signal or processed to generate the input signal;
   wherein the adaptive adjusting unit controls at least one of the resistance of the resistor, the capacitance of the first capacitor and the capacitance of the second capacitor, and thereby form a nonlinear relation between the output signal and the phase error signal.

2. The phase-locked loop of claim 1 further comprising a frequency divider for outputting the input signal according to the output signal.

3. The phase-locked loop of claim 1, wherein the adaptive adjusting unit outputs the control signal according to a peak-to-peak value of the phase error signal.

4. The phase-locked loop of claim 1, wherein the adaptive adjusting unit outputs the control signal according to a root mean square (RMS) value of the phase error signal.

5. The phase-locked loop of claim 1, wherein the adaptive adjusting unit outputs the control signal according to a maximum value of the phase error signal.

6. The phase-locked loop of claim 1, wherein the adaptive adjusting unit outputs the control signal according to a minimum value of the phase error signal.

7. A phase-locked loop comprising:
   a phase/frequency detector for generating a phase error signal according to a reference signal and an input signal;
   a quantizer for outputting a quantized phase error signal according to the phase error signal;
   a count control circuit comprising a mapping table for outputting a count control signal according to a value of the quantized phase error signal, the mapping table storing a nonlinear relation between the quantized phase error signal and the count control signal; and
   a numerical controlled oscillator for outputting an output signal according to the count control signal;
   wherein the output signal and the phase error signal have a nonlinear relation through the control of the count control circuit.

8. The phase-locked loop of claim 7, wherein the count control circuit further comprises a proportional/integral controller (P/I controller), and the count control signal comprises a proportional signal and an integral signal.

9. The phase-locked loop of claim 8, wherein the P/I controller comprises an infinite impulse response filter.

10. The phase-locked loop of claim 7, wherein the numerical controlled oscillator comprises a period control word (PCW) unit.

11. The phase-locked loop of claim 7 further comprising a frequency divider for outputting the input signal according to the output signal.

12. A phase-locked loop with nonlinear phase-error response characteristic, comprising:
   a phase/frequency detector for generating a phase error signal according to a reference signal and an input signal;
   an adaptive adjusting unit for receiving the phase error signal and thereby outputting a control signal according to the phase error signal;
   a charge pump for outputting a charge signal according to the control signal, comprising:
      a plurality of current sources coupled to each other by a plurality of switches, wherein the on/off states of the plurality of switches changes according to the control signal;
   a charge-controlled circuit for outputting a voltage signal according to the charge signal;
   a voltage-controlled oscillator for outputting an output signal according to the voltage signal; and
   a frequency divider for generating the input signal according to the output signal;
   wherein when the on/off states of the plurality of switches changes according to the control signal, the relation between the phase error signal and the output signal changes in a nonlinear way.

13. The phase-locked loop of claim 12, wherein the adaptive adjusting unit outputs the control signal according to a peak-to-peak value of the phase error signal.

14. The phase-locked loop of claim 12, wherein the adaptive adjusting unit outputs the control signal according to a root mean square (RMS) value of the phase error signal.

15. The phase-locked loop of claim 12, wherein the adaptive adjusting unit outputs the control signal according to a maximum value of the phase error signal.

16. The phase-locked loop of claim 12, wherein the adaptive adjusting unit outputs the control signal according to a minimum value of the phase error signal.

* * * * *